United States Patent [19]

Matsuoka et al.

[11] Patent Number: 4,751,682
[45] Date of Patent: Jun. 14, 1988

[54] SENSE CIRCUIT

[75] Inventors: Shigeki Matsuoka, Suita; Takayoshi Shimizu; Takao Jinzai, both of Ikeda, all of Japan

[73] Assignee: Ricoh Company, Ltd., Tokyo, Japan

[21] Appl. No.: 829,799

[22] Filed: Feb. 14, 1986

[30] Foreign Application Priority Data

[JP] Japan ..................................

[51] Int. Cl.⁴ ............................................. G11C 7/02
[52] U.S. Cl. ..................................... 365/210; 365/208
[58] Field of Search ............... 365/210, 207, 208, 241, 365/205

[56] References Cited

U.S. PATENT DOCUMENTS 4,270,190 5/1981 Jindra et al. ..................... 365/210 X
4,494,219 1/1985 Tanaka et al. ................... 365/210 X Primary Examiner—Joseph A. Popek
Attorney, Agent, or Firm—Cooper & Dunham

[57] ABSTRACT

A sense circuit for sensing a memory state of a memory transistor in a semiconductor memory device by determining whether the memory transistor is on or off is provided. The sense circuit includes a first load P-channel MOS transistor for supplying a first current to the memory transistor, a reference transistor capable of passing a second current same in magnitude as the on current of the memory transistor, and a second load P-channel MOS transistor for supplying the second current to the reference transistor, whereby the second load P-channel MOS transistor is operatively coupled to the first load P-channel MOS transistor.

7 Claims, 3 Drawing Sheets

SENSE CIRCUIT

BACKGROUND OF THE INVENTION

1. Field of the Invention

This invention generally relates to a semiconductor memory circuit, and, in particular, to a sense circuit for sensing the memory state of a memory cell in a semiconductor memory device, such as a read only memory (ROM), a programmable read only memory (PROM) or an erasable programmable read only memory (EPROM).

2. Description of the Prior Art

A typical prior art sense circuit for use in a semiconductor memory device is schematically shown in FIG. 6. A semiconductor memory device includes a plurality of memory cells, including a memory cell transistor M1, which are connected to a common sense point D1. The memory cell transistor M1 is connected between the sense point D1 and ground and has its gate connected to a word line W1 through a buffer circuit. Connected to each sense point D1 through an N-channel MOS transistor Q2a is a load P-channel MOS transistor for supplying current to a memory cell during read mode. The gate of the load MOS transistor Q1a is set at ground level during operation. A circuit C1 comprised of a P-channel MOS transistor Q3 and an N-channel MOS transistor Q4 is provided for detecting the level of voltage at the sense point D1, and the gate of the transistor Q4 is connected to the sense point D1. An interconnection node N1 between the MOS transistors Q3 and Q4 is connected to the gate of the MOS transistor Q2a. With this structure, the on/off state of the memory cell M1 is detected by the bit line voltage detecting circuit C1 as the voltage change at the sense point D1, and the impedance of the transistor Q2a is controlled, whereby the voltage level at the node N2a between the transistors Q1a and Q2a is varied. A circuit comprised of a P-channel MOS transistor Q5 and an N-channel MOS transistor Q6 serves to supply current to the sense point D1, together with the load MOS transistor Q1a, when the memory cell M1 is on, thereby controlling the lowering of the voltage at the sense point D1 so as to reduce the access time period.

FIG. 7 schematically shows another prior art sense circuit which is often found in a semiconductor memory device, typically ROM. In the structure shown in FIG. 6, the current supplying circuit comprised of the transistors Q5 and Q6 is controlled by the bit line voltage detecting circuit C1; whereas, in the sense circuit shown in FIG. 7, the current supplying circuit comprised of transistors Q5a and Q6a is controlled by a separately provided bit line voltage detecting circuit C1a. Other than that, the structures shown in FIGS. 6 and 7 are similar.

In such a sense circuit, a driver current Il of the load transistor is typically set between an on current Ioff Ion when the memory cell M1 is on and an off current when the memory cell M1 is off, so that Il is larger than Ioff but smaller than Ion. In this case, a sense margin for detecting the on state of the memory cell M1 is given by (Ion−Il) and a sense margin for detecting the off state of the memory cell M1 is given by (Il−Ioff). However, in such a sense circuit, changes of Il and Ion do not compensate each other. As a result, there are brought about the following disadvantages. (1) Even if Ion fluctuates due to fluctuations in channel length and/or threshold voltage of a memory cell transistor, which are typically caused by fluctuations in manufacture, since Il, which is determined by the size of the load transistor Q1a, remains at constant, the sense margin at the on side, i.e., (Ion−Il), fluctuates. That is, for example, if Il is set as shown in FIG. 8, when the on current Ion decreases, the on-side sense margin decreases, and, thus, the on-side access time period for detection of the on state increases as shown in FIG. 9. (2) The changes of Il are smaller as compared with changes of Ion due to fluctuations of supply voltage $V_{cc}$, so that the on-side sense margin in this case also fluctuates. (3) In the case when Il changes due to fluctuations in transconductance, threshold voltage and/or channel length of the load transistor Q1a, which are caused by fluctuations in manufacture, and Ion remains at constant in contrast to case (1), the on-side sense margin also fluctuates.

SUMMARY OF THE INVENTION

It is therefore a primary object of the present invention to obviate the disadvantages of the prior art as described above and to provide an improved sense circuit for use in a semiconductor memory device.

Another object of the present invention is to provide an improved sense circuit capable of maintaining a relatively broad sense margin even in the case when fluctuations are present in the on current of a memory cell transistor, in the transistor factors and process parameters of a load transistor, and/or in the supply voltage due to fluctuations in manufacturing process.

A further object of the present invention is to provide an improved sense circuit for sensing the on/off state of a memory cell transistor in a semiconductor memory device, such as a ROM.

A still further object of the present invention is to provide an improved sense circuit high in performance and stability.

Other objects, advantages and novel features of the present invention will become apparent from the following detailed description of the invention when considered in conjunction with the accompanying drawings.

DESCRIPTION OF THE PREFERRED EMBODIMENTS

Figure 1:
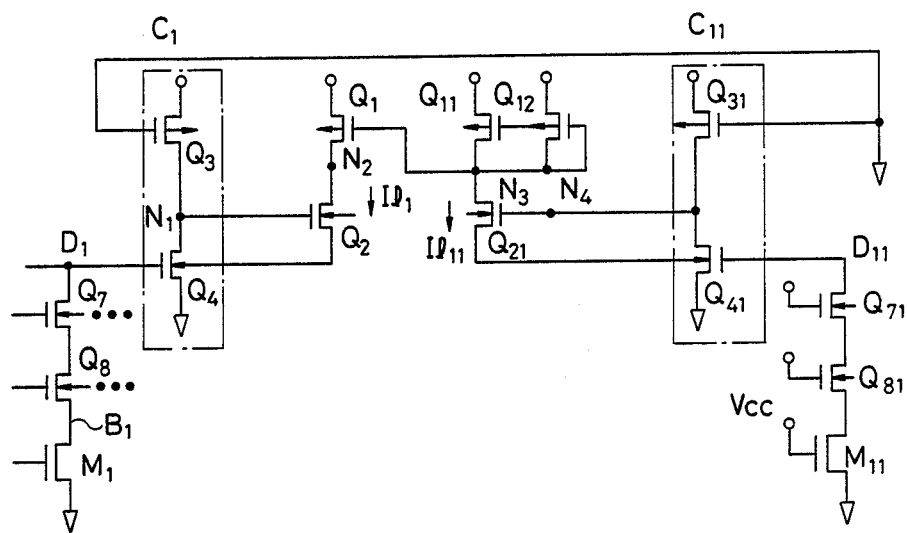
FIG. 1 is a circuit diagram showing a sense circuit suitable for use in a semiconductor memory circuit constructed in accordance with one embodiment of the present invention.

Referring now to FIG. 1, there is schematically shown a sense circuit for sensing the on/off state of a memory cell transistor provided in a semiconductor memory device, such as a ROM. In this structure, there is provided a load P-channel MOS transistor Q1 which supplies current to a memory cell transistor M1, whereby the on/off state of the memory cell transistor M1 is determined to detect the memory state thereof. The structure shown in FIG. 1 also includes at least one reference cell transistor M11 capable of supplying current same in magnitude as the on current of the memory cell transistor M1, and the reference cell transistor M11 has its gate connected to receive a reading supply voltage $V_{cc}$. Alternatively, the gate of the reference cell transistor M11 is connected to a buffer circuit which is similar to a buffer circuit for driving the memory cell transistor M1. The reference cell transistor M11 is connected to a load circuit which supplies current thereto and which is comprised of at least one P-channel MOS transistor whose W/L ratio, where W is a channel width and L is a channel length, is larger than that of the load MOS transistor Q1 associated with the memory cell M1, or, alternatively, which is comprised of a pair of P-channel MOS transistors Q11 and Q12 connected in parallel and having a W/L ratio same as that of the load MOS transistor Q1 associated with the memory cell transistor M1. Each of the MOS transistors Q11 and Q12 defining a load circuit associated with the reference cell transistor M11 has its gate connected to its drain and also to the gate of the load transistor Q1 associated with the memory cell M1.

As shown in FIG. 1, there is provided a sense circuit for sensing the memory state of a memory cell transistor in a semiconductor memory device which includes a bit line B1 and a plurality of memory cell transistors, including a memory cell transistor M1, each of which is connected to the bit line B1. It is to be noted that a plurality of bit lines (only two more bit lines are shown in FIG. 1) are normally provided and one of such a plurality of bit lines is selected by a multiplexer comprised of transistors including Q7 and Q8 to be connected to the sense point D1. Also provided is a load P-channel MOS transistor Q1 which is also associated with the sense point D1 and which supplies current to the memory cell transistor through an N-channel MOS transistor Q2. Also provided is a bit line voltage detecting circuit C1 which is comprised of a CMOS inverter including a P-channel MOS transistor Q3 as a load. The CMOS inverter of circuit C1 also includes an N-channel MOS transistor Q4 which has its gate connected to the sense point D1, whereby the voltage of the bit line selected by the multiplexer is detected. An interconnection node N1 between the MOS transistors Q3 and Q4 defining an output terminal of the bit line voltage detecting circuit C1 is connected to the gate of the MOS transistor Q2.

Also provided in the structure shown in FIG. 1 is a reference cell transistor M11 which is provided at least one for a memory cell transistor, such as memory cell transistor M1, which stores memory information. The reference cell transistor M11 is comprised of a MOS transistor which is the same in size as the associated memory cell transistor M1 and which is capable of flowing current same in magnitude as that of the on current of the memory cell transistor M1. The reference cell transistor M11 has its gate connected to a terminal of supply voltage $V_{cc}$ which is used for data read out. In order to supply current to the reference cell transistor M11, there is provided a load circuit comprised of a pair of P-channel MOS transistors Q11 and Q12 which are connected in parallel and which are same in size as the load transistor Q1 at the memory cell side. These transistors Q11 and Q12 have their drains commonly connected to define a node N3 and have their gates connected to the node N3, which is also connected to the gate of the load transistor Q1 at the memory cell side.

Between the node N3 of the reference side load circuit and the reference cell transistor M11 are connected an N-channel MOS transistor Q21 same in size as the corresponding transistor Q2 at the memory cell side and also N-channel MOS transistors Q71 and Q81 same in size as the multiplexing transistors Q7 and Q8 at the memory cell side. The transistors Q71 and Q81 have their gates connected to supply voltage $V_{cc}$. Also provided at the reference cell side is a reference side bit line voltage detecting circuit C11 similar to the bit line voltage detecting circuit C1 at the memory cell side, and the detecting circuit C11 is comprised of a CMOS inverter including a pair of P-channel and N-channel MOS transistors Q31 and Q41 same in size as the corresponding transistors Q3 and Q4 in the bit line voltage detecting circuit C1 at the memory cell side. The gate of transistor Q31 of the reference side bit line voltage detecting circuit C11 is connected to ground and the gate of the transistor Q41 is connected to a sense point D11 at the reference cell side. In addition, an interconnection node N4 between the transistors Q31 and Q41 of the bit line voltage detecting circuit C11 at the reference cell side is connected to the gate of the transistor Q21.

In operation, the transistors Q11 and Q12 forming the load circuit of the reference cell transistor M11 supply a load current $Il_{11}$ which corresponds to the on current of the reference cell transistor M11. Under this condition, the voltage at the node N3 is determined such that the load current $Il_{11}$ is supplied through the pair of transistors Q11 and Q12. Since the node N3 is also connected to the gate of the load transistor Q1 associated with the memory cell transistor, the driver current $Il_1$ of the load transistor Q1 becomes $Il_{11}/2$. Since $Il_{11}$ is also equal to the on current of the memory cell transistor M1, we have $Il_1 = $ (on current)/2.

Figure 2:
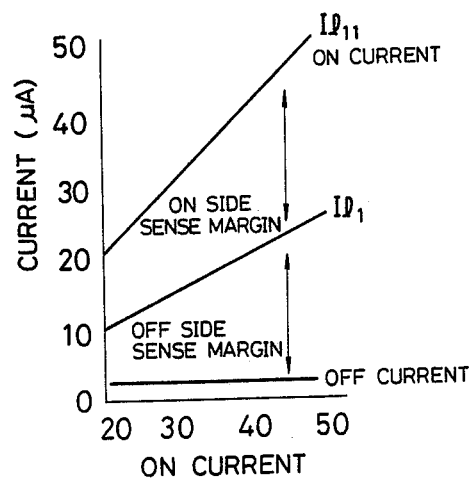
FIGS. 2 and 3 are graphs showing how the sense margin and the access time period vary as a function of the on current of a memory cell in the structure shown in FIG. 1, respectively.
Figure 3:
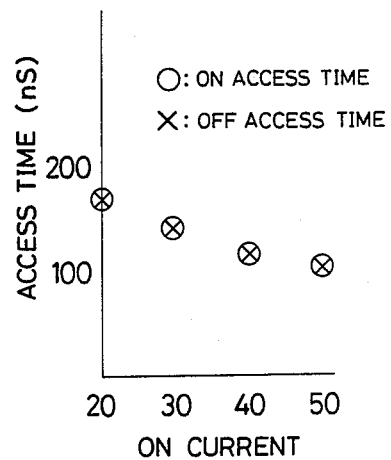
Figure 9:
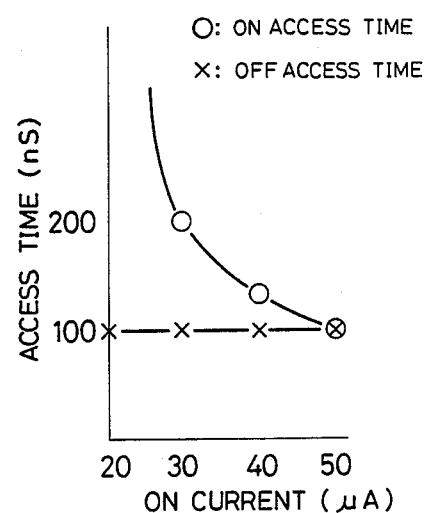

In other words, the load current $Il_1$ for the memory cell transistor M1 is uniquely determined by the on current of the memory cell transistor M1 irrespective of the transistor factors, such as channel width and channel length, and process parameters, such as transconductance and threshold voltage, of the load transistor Q1. As a result, the sense margins both at the on and off sides vary as a function of the on current of the memory cell transistor M1 as graphically shown in FIG. 2, so that there are obtained broader operational margins. Accordingly, the access time at either of the on side or the off side varies gradually as graphically shown in FIG. 3, and, thus, there is no rapid change in access time for the reduction of the on current of the memory cell transistor M1 as different from the prior art performance shown in FIG. 9.

In the embodiment shown in FIG. 1, use is made of a pair of MOS transistors Q11 and Q12 for forming the load circuit at the reference cell side. However, as an alternative structure, use may be made of a single MOS transistor having a W/L ratio larger than that of the load transistor Q1 at the memory cell side for forming the load circuit at the reference cell side. As a further alternative structure, use may also be made of three or more MOS transistors connected in parallel to define the load circuit at the reference cell side. The voltage at the node N3 is determined by the on current of the reference cell transistor M11 and the size of each of the MOS transistors Q11 and Q12 which form the reference side load circuit. However, the size of each of the transistors Q11 and Q12 is preferably so set that the voltage at the node N3 is higher than the voltage at the reference cell side sense point D11.

Figure 4A:
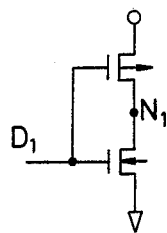
FIGS. 4a and 4b are circuit diagrams showing alternative structures for the bit line voltage detecting circuit shown in FIG. 1.
Figure 4B:
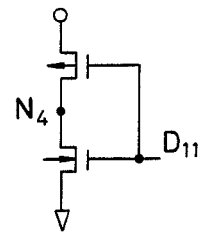

In the embodiment shown in FIG. 1, the gate of the reference cell transistor M11 is connected to the supply voltage terminal, but, alternatively, this gate may also be connected to a buffer circuit similar to a buffer circuit connected to the gate of the memory cell transistor M1. Moreover, the bit line voltage detecting circuits C1 and C11 shown in FIG. 1 may be substituted by CMOS inverters shown in FIGS. 4a and 4b, respectively.

Figure 5:
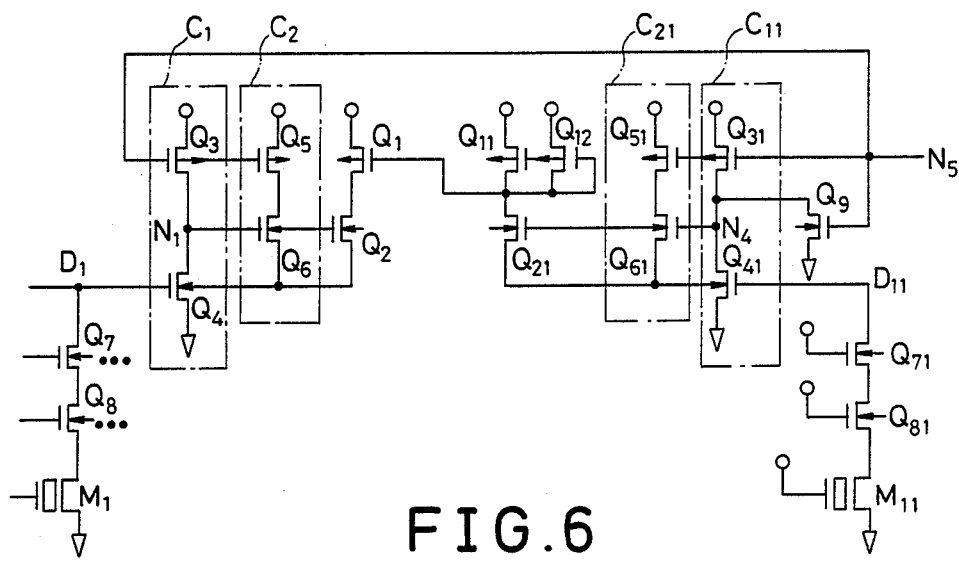
FIG. 5 is a circuit diagram showing a sense circuit constructed in accordance with another embodiment of the present invention.
Figure 6:
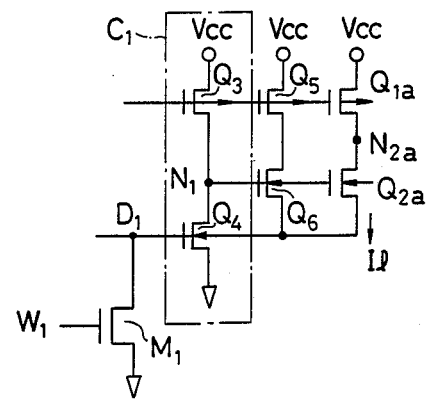
FIGS. 6 and 7 are circuit diagrams which show typical prior art sense circuits for use in a semiconductor memory device.
Figure 7:
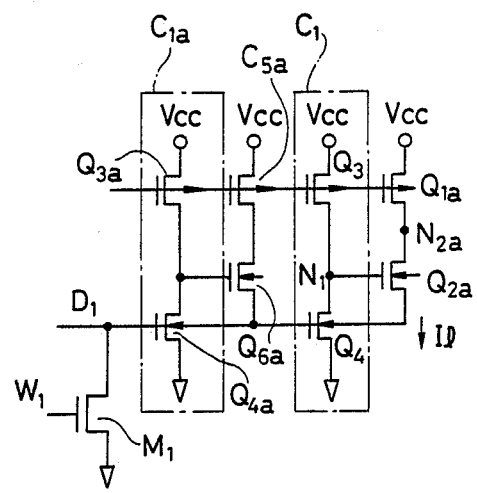
Figure 8:
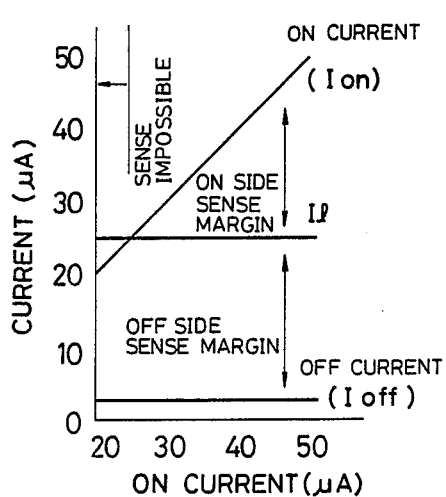
FIGS. 8 and 9 are graphs showing how the sense margin and the access time period vary as a function of the on current of a memory cell in the prior art sense circuits.

FIG. 5 shows a sense circuit constructed in accordance with another embodiment of the present invention and similar in many respects to the previous embodiment shown in FIG. 1. Thus, the elements which are identical to those shown in FIG. 1 are indicated by identical reference characters in FIG. 5. In the embodiment shown in FIG. 5, in order to prevent the occurrence of lowering of voltage at the sense point D1 at the memory cell side, there is provided a current supplying circuit C2 comprised of a pair of P-channel and N-channel MOS transistors Q5 and Q6 connected to the sense point D1 in a manner similar to the prior art sense circuit shown in FIG. 6. Also at the sense point D11 at the reference cell side, there is provided a current supplying circuit C21 comprised of a pair of P-channel and N-channel MOS transistors Q51 and Q61 associated with the sense point D11 at the reference cell side. The P-channel transistors Q3, Q5, Q31, and Q51 have their gates connected to a control line N5, and the node N4 of the reference side bit line voltage detecting circuit C11 is connected to the drain/source of the N-channel MOS transistor Q9 which has its gate also connected to the control line N5. The control line N5 is normally set at the ground voltage, but it is set at the supply voltage $V_{cc}$ during the stand-by mode, whereby the transistors Q3, Q5, Q31, and Q51 are turned off and the transistor Q9 is turned on, thereby disconnecting the series path among those transistors to reduce the amount of power dissipation. In the present embodiment, use is made of a FAMOS or stacked-gate MOS transistor as the memory cell and reference cell transistors M1 and M11, respectively.

As described above, in accordance with the present invention, there is provided a sense circuit for reading out the memory state of a memory cell in a semiconductor memory device, which is so structured that the driver current of a load transistor associated with a memory cell transistor is determined by the on current of the memory cell transistor. Accordingly, the following advantages can be attained.

(1) A broader sense margin is provided for fluctuations in the on current of a memory cell transistor due to fluctuations in channel length and/or threshold voltage of a memory cell transistor, which are brought about by fluctuations in a manufacturing process.

(2) A broader sense margin is also provided for fluctuations in the supply voltage.

(3) A broader sense margin is also provided for fluctuations in the characteristics of a load transistor in the sense circuit, such as channel length, threshold voltage, and/or transconductance.

While the above provides a full and complete disclosure of the preferred embodiments of the present invention, various modifications, alternate constructions and equivalents may be employed without departing from the true spirit and scope of the invention. Therefore, the above description and illustration should not be construed as limiting the scope of the invention, which is defined by the appended claims.

What is claimed is:

1. A sense circuit for sensing a memory state of a memory transistor in a memory device by determining whether said memory transistor is in an on state or an off state, comprising:
   a memory transistor connected between a first sense node and a reference potential;
   first sensing means connected to said first sense node for sensing a voltage at said first sense node;
   first current supplying means for supplying a first current to said memory transistor so as to determine the on/off state of said memory transistor;
   reference means connected between a second sense node and said reference potential and capable of passing a second current which may be same in magnitude as an on current of said memory transistor;
   second sensing means connected to said second sense node for sensing a voltage at said second sensing node; and
   second current supplying means for supplying said second current to said reference means, said second current supplying means being operatively coupled to said first current supplying means to control said first current in accordance with said second current, wherein said first current is a saturation current if said memory transistor is on and said first current is a non-saturation current if said memory transistor is off.

2. The sense circuit of claim 1, wherein said first non-saturation current is half of said first saturation current.

3. The sense circuit of claim 2 wherein said first current supplying means includes a load P-channel MOS transistor having a first drain/source connected to a supply voltage, a second drain/source connected to supply said first current toward said memory transistor, and a gate connected from said second current supplying means.

4. The sense circuit of claim 3 wherein said second current supplying means includes a load circuit for supplying said second current.

5. The sense circuit of claim 4 wherein said load circuit includes at least one P-channel MOS transistor whose W/L ratio, where W is channel width of a MOS transistor and L is a channel length of the MOS transistor, is larger than that of said load P-channel MOS transistor of said memory transistor.

6. The sense circuit of claim 4 wherein said load circuit includes at least two P-channel MOS transistors connected in parallel, each of which has a W/L ratio, where W is a channel width of a MOS transistor and L is a channel length of the MOS transistor, which is equal to that of the load P-channel MOS transistor of said memory transistor.

7. The sense circuit of claim 6 wherein said P-channel MOS transistors have their drains commonly connected and connected to their gates and also to the gate of said load transistor of said memory transistor.

* * * * *